(12) United States Patent
Heddes et al.

(10) Patent No.: US 11,720,252 B1
(45) Date of Patent: Aug. 8, 2023

(54) METHOD AND APPARATUS FOR COMPRESSING AND DECOMPRESSING SPARSE DATA SETS

(71) Applicant: Microsoft Technology Licensing, LLC, Redmond, WA (US)

(72) Inventors: Mattheus C. Heddes, Richmond, WA (US); Ankit More, San Mateo, CA (US); Nishit Shah, Sunnyvale, CA (US); Torsten Hoefler, Zurich (CH)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/687,584

(22) Filed: Mar. 4, 2022

(51) Int. Cl.
*G06F 3/06* (2006.01)

(52) U.S. Cl.
CPC .......... *G06F 3/0608* (2013.01); *G06F 3/0655* (2013.01); *G06F 3/0679* (2013.01)

(58) Field of Classification Search
CPC ..... G06F 3/0608; G06F 3/0655; G06F 3/0679
USPC ........................................................ 711/154
See application file for complete search history.

(56) References Cited

U.S. PATENT DOCUMENTS

| 10,411,727 | B1 | 9/2019 | Lan et al. | |
|---|---|---|---|---|
| 11,528,033 | B2 * | 12/2022 | Corkery | H03M 7/70 |
| 2017/0214928 | A1 * | 7/2017 | Cook | H04N 19/182 |
| 2017/0293659 | A1 | 10/2017 | Huang | |
| 2020/0285618 | A1 * | 9/2020 | Albericio Latorre | H03M 7/30 |
| 2021/0240684 | A1 | 8/2021 | Xiao et al. | |

OTHER PUBLICATIONS

"International Search Report issued in PCT Application No. PCT/US22/051121", dated Mar. 24, 2023, 13 Pages.

* cited by examiner

*Primary Examiner* — Hashem Farrokh
(74) *Attorney, Agent, or Firm* — Fountainhead Law Group PC (57) ABSTRACT

Embodiments of the present disclosure include a digital circuit and method for multi-stage compression. Digital data values are compressed using a multi-stage compression algorithm and stored in a memory. A decompression circuit receives the values and performs a partial decompression. The partially compressed values are provided to a processor, which performs the final decompression. In one embodiment, a vector of N length compressed values are decompressed using a first bit mask into two N length sets having non-zero values. The two N length sets are further decompressed using two M length bit masks into M length sparse vectors, each having non-zero values.

20 Claims, 6 Drawing Sheets

METHOD AND APPARATUS FOR COMPRESSING AND DECOMPRESSING SPARSE DATA SETS

BACKGROUND

The present disclosure relates generally to digital circuits and systems, and in particular to a method and apparatus for compression multiplexing for sparse computations.

Many modern digital systems and applications are required to process large volumes of digital values. For example, artificial intelligence applications may be required to store (e.g., in memory) and process (e.g., perform mathematical operations) are huge arrays of digital values representing activations or weights. However, in many cases such large volumes of data may contain a large number of zero values. Computation of zero values is often an exception for processing and may be skipped or otherwise ignored by a system.

Input data sets typically have zero values and non-zero values randomly distributed over the data set with zero values typically representing a certain percentage (referred to as sparsity) of the total data set. For AI accelerators and workloads, for example, sparsity is an increasingly important feature that needs to be supported in hardware to achieve performance speed-up. In particular, storing and retrieving data sets from memory constitutes a burdensome overhead for the system.

Embodiments described herein advantageously store compressed data in memory to reduce memory bandwidth associated with reading data out of memory into a processor.

DETAILED DESCRIPTION

Described herein is a hierarchical compression technique. In the following description, for purposes of explanation, numerous examples and specific details are set forth in order to provide a thorough understanding of some embodiments. Various embodiments as defined by the claims may include some or all of the features in these examples alone or in combination with other features described below and may further include modifications and equivalents of the features and concepts described herein.

In some embodiments, features and advantages of the present disclosure include circuit techniques for compressing and decompressing sets of digital values to and from memory to advantageously reduce memory read and write times and increase memory bandwidth. The techniques described herein have a wide range of uses, including use an artificial intelligence processors, for example.

Figure 1:
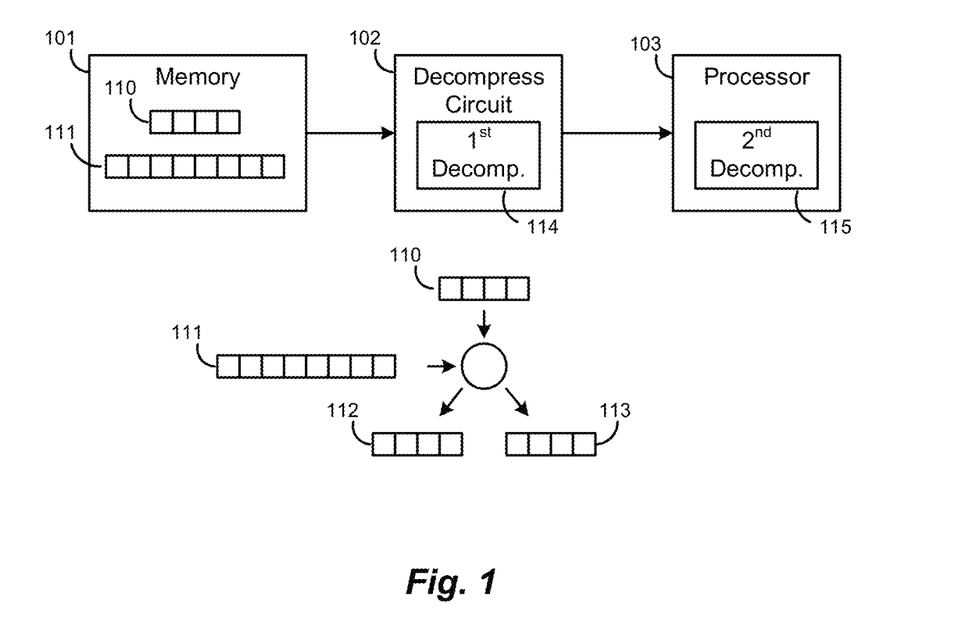
FIG. 1 illustrates a digital circuit according to an embodiment.

FIG. 1 illustrates a digital circuit according to an embodiment. Features and advantages of the present disclosure include retrieving compressed digital values from memory, decompressing the digital values using a first decompression algorithm, and sending compressed digital values to a processor for further processing. For example, in some embodiments, a processor may further decompress the digital values, while in some embodiments a processor may be able to operate on compressed values. As mentioned above, the presently disclosed hierarchical approach reduces memory transaction time and allows processors to retrieve data faster. In one embodiment, the present disclosure includes a memory 101 storing data comprising a plurality of digital values. In various embodiments, the data is compressed using a multi-stage (aka multi-level) compression algorithm. Accordingly, data may be read from memory 101 and received by a decompression circuit 102, which performs a first decompression 114. Decompression circuit 102 may receive N non-zero digital values and produce two sets of digital values of length N, for example. Processor 103 may receive the results of the first decompression from circuit 102 and perform a second decompression 115. In various embodiments, the present techniques may be used advantageously on sparse data sets as described in more detail below, and the first and second decompressions are part of a multi-stage interdependent sparsity based compression algorithm, for example.

More specifically, in one example embodiment, memory 101 stores N non-zero digital values in a block 110, where N is a first integer (e.g., N=32). Further, the N non-zero digital values 110 may be associated with a bit mask 111 specifying positions of the N non-zero digital values. In this example, the bit mask is of length 2*N. It is to be understood that bit masks described herein may use a variety of techniques to specify the positions of NZ values, including various forms of delta coding or positional coding, for example. Decompression circuit 102 receives the N non-zero digital values 110 and the 2*N length bit mask 111 and produce two N length sets of digital values 112 and 113. Each of the two N length sets of digital values 112 and 113 may comprise N/2 non-zero digital values from the N non-zero digital values. Positions of the N/2 non-zero digital values in each of the two N length sets of digital values 112 and 113 may be set based on the 2*N length bit mask, for example. Processor 103 receives the two N length sets of digital values and two M length bit masks (not shown), where M is a second integer greater than N, and decompress the two N length sets of digital values into two M length sets of digital values each comprising N/2 non-zero elements. M divided by N (M/N) may be a power of 2, for example (e.g., $128/32=4=2^2$), as illustrated in the examples below.

Figure 2:
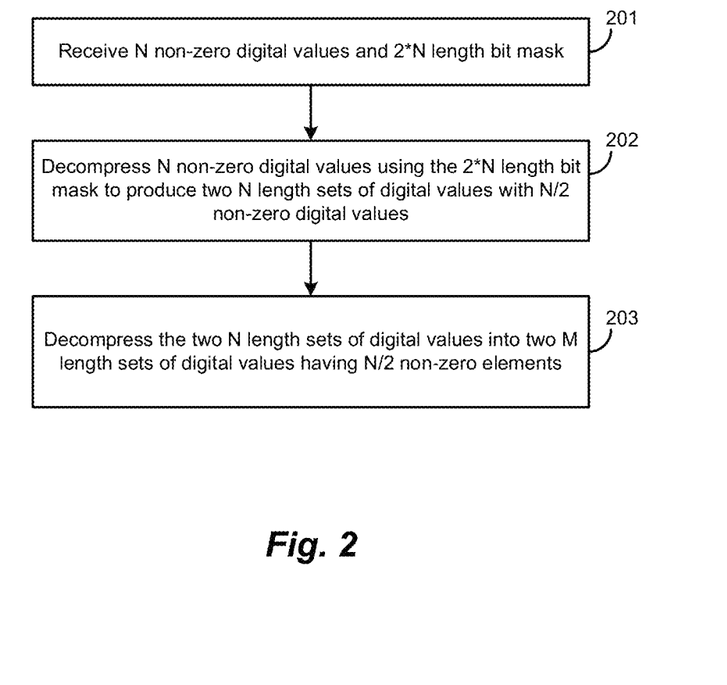
FIG. 2 illustrates a method according to an embodiment.

FIG. 2 illustrates a method decompressing data according to an embodiment. At 201, N non-zero digital values and a bit mask of length 2*N are received from a memory (e.g., in a decompression circuit). At 202, the N non-zero digital values are decompressed using the 2*N length bit mask to produce two N length sets of digital values each comprising N/2 non-zero digital values from the N non-zero digital values. Positions of the N/2 non-zero digital values in each of the two N length sets of digital values may be set based on the 2*N length bit mask, for example. At 203, the two N length sets of digital values and two M*N length bit masks are received in a processor, where M is a second integer greater than N. The processor may decompress the two N length sets of digital values into two M length sets of digital values each comprising N/2 non-zero elements. However, as mentioned above, in some embodiments, a processor may be able to operate on compressed values.

Figure 3:
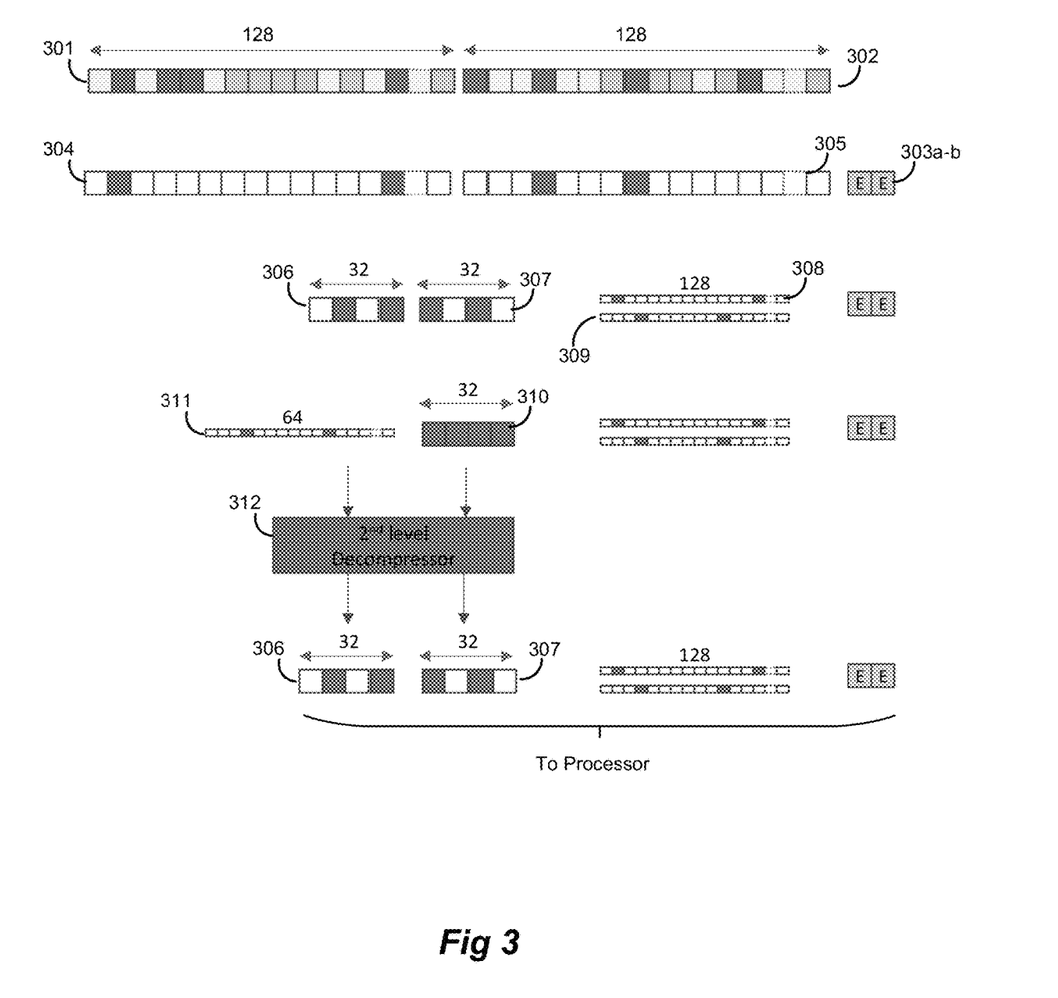
FIG. 3 illustrates an example compression and decompression technique according to an embodiment.

FIG. 3 illustrates an example compression and decompression technique according to an embodiment. The present example illustrates one multi-stage compression technique for storage data in a memory. In this example, two sets of data 301 and 302 each have M=128 digital values. For the first level compression, 16 (e.g., N/2=16) NZ digital values out of each of the 128 digital values are selected. The selected digital values may be the largest 16 values in each data set, for example. The result is two data sets 304 and 305, which are referred to as "sparsified" (i.e., made sparse), each comprising 128 values of which 16 in each set are NZ. The 128 length data sets may comprise 8-bit mantissas, a sign bit, and a shared exponent illustrated at 303a-b, for example. Additionally, first and second 128 length bit masks 308 and 309 specifying the positions of the 16 NZ values in each set are generated. Next, two 32 length sets 306 and 307 are generated, one from each of the 128 length sets 304 and 305. 32 length sets 306 and 307 each include 16 NZ values from the corresponding 128 length sets.

For the second level compression, a 64 length bit mask 311 is generated. Bit mask 311 specifies the positions of the 16 NZ values in each 32 length set 306 and 307. For example, a first half of a 64 bit bit mask may include a '1' in positions where a value is NZ in set 306 and a second half of the 64 bit bit mask may include a '1' in positions where a value is NZ in set 307. Next, a 32 length set 310 of NZ values is generated from the NZ values in the two 32 length sets 306 and 307. The 32 length set 310 of NZ values may be stored in a memory with the 64 length bit mask 311 and the 128 length bit masks 308 and 309.

The multi-stage compressed data may be retrieved at much higher rates than uncompressed or less compressed data. For instance, the 32 length set 310 of NZ values, the 2*N length bit mask 311, and the first and second 128 length bit masks may be retrieved from memory and coupled to a $2^{nd}$ level decompression circuit 312. Decompression circuit 312 decompresses the 32 length set 310 of NZ values into two 32 length sets that each have 16 NZ values. The 64 length bit mask 311 is used for the second level decompression. Circuit 312 is referred to as "$2^{nd}$ level" decompression because it decompresses the 32 length NZ values back into two 32 length values 306 and 307, which is the decompression associated with the $2^{nd}$ level compression described above. Finally, 32 length sets 306 and 307 and 128 length bit masks 308 and 309 (and shared exponents 303a-b) may be sent to a processor for $1^{st}$ level decompression, where the two 32 length sets are decompressed into two 128 length sets 304 and 305, each having 16 NZ digital values, using the first and second 128 length bit masks 308 and 309.

Figure 4:
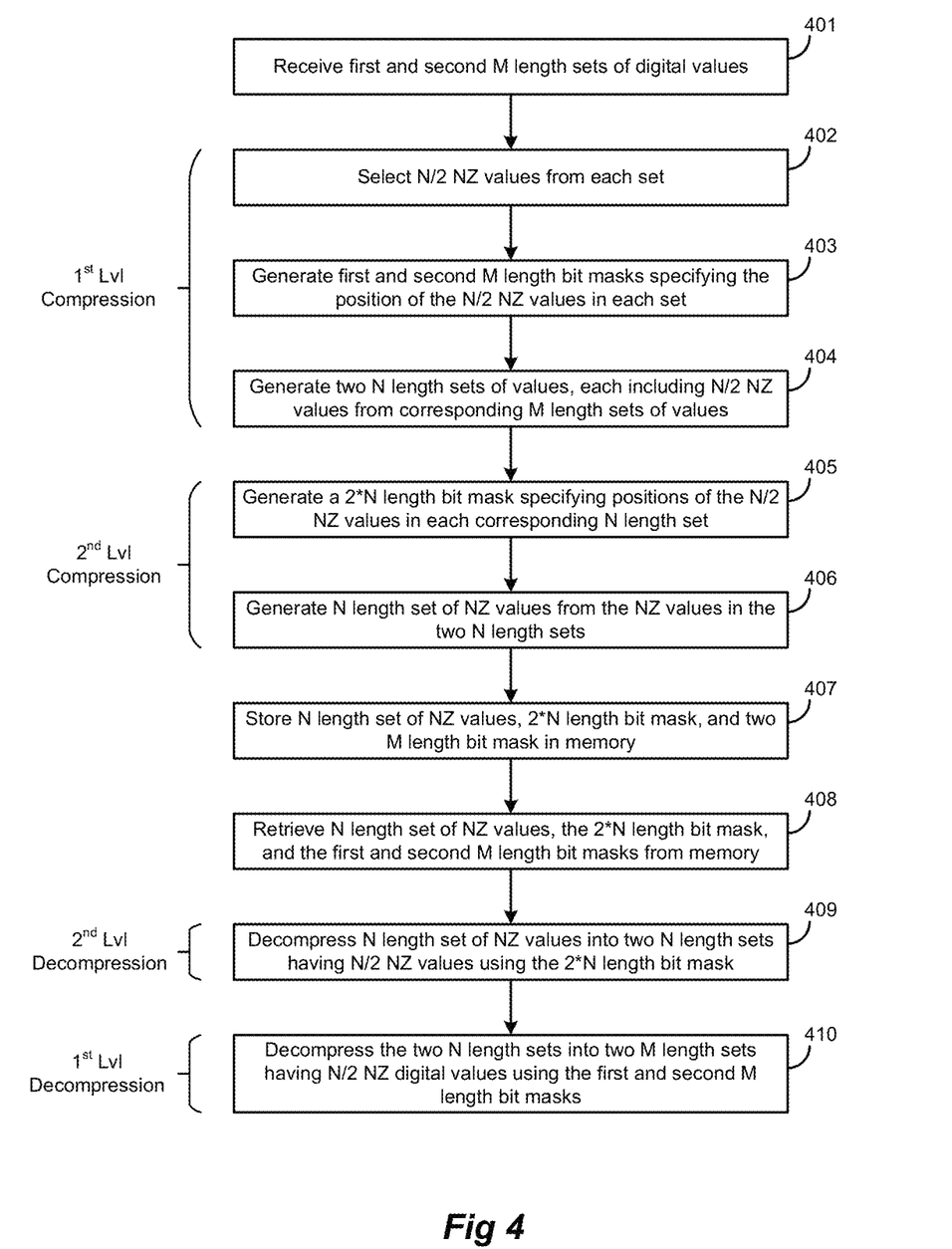
FIG. 4 illustrates an algorithm for compressing and decompressing data according to an embodiment.

FIG. 4 illustrates an algorithm for compressing and decompressing data according to an embodiment. At 401, first and second M length sets of digital values are received. At 402, N/2 non-zero (NZ) digital values are selected from the first set and N/2 non-zero (NZ) digital values are selected from the second set. At 403, first and second M length bit masks are generated. The M length bit masks specify the positions of the N/2 NZ values in each set selected at 402. At 404, two N length sets of values are generated. Each N length set of values includes N/2 NZ values from the two M length sets. Steps 402-404 constitute a first level compression of the multi-stage compression in this example.

The following steps 405-406 constitute a second level compression of the multi-stage compression in this example. At 405, a 2*N length bit mask is generated that specifies the positions of the N/2 NZ values in each N length set. At 406, an N length set of NZ values is generated from the NZ values in the two N length sets. At 407, the N length set of NZ values, the 2*N length bit mask, and the first and second M length bit masks may be stored in a memory circuit.

The N length set of NZ values, the 2*N length bit mask, and the first and second M length bit masks may be retrieved from memory at 408. At 409, the $2^{nd}$ level decompression step occurs, wherein the N length set of NZ values are decompressed into two N length sets having N/2 NZ values using the 2*N length bit mask. The $1^{st}$ level decompression occurs at 410, where the two N length sets are decompressed into two M length sets having N/2 NZ digital values using the first and second M length bit masks. The $1^{st}$ level compression may be performed by a processor, such as an artificial intelligence processor or other processor configured to process sparse data sets (e.g., data sets with a significant number of zero values where zero values are skipped and/or where NZ value processing is accelerated).

Figure 5:
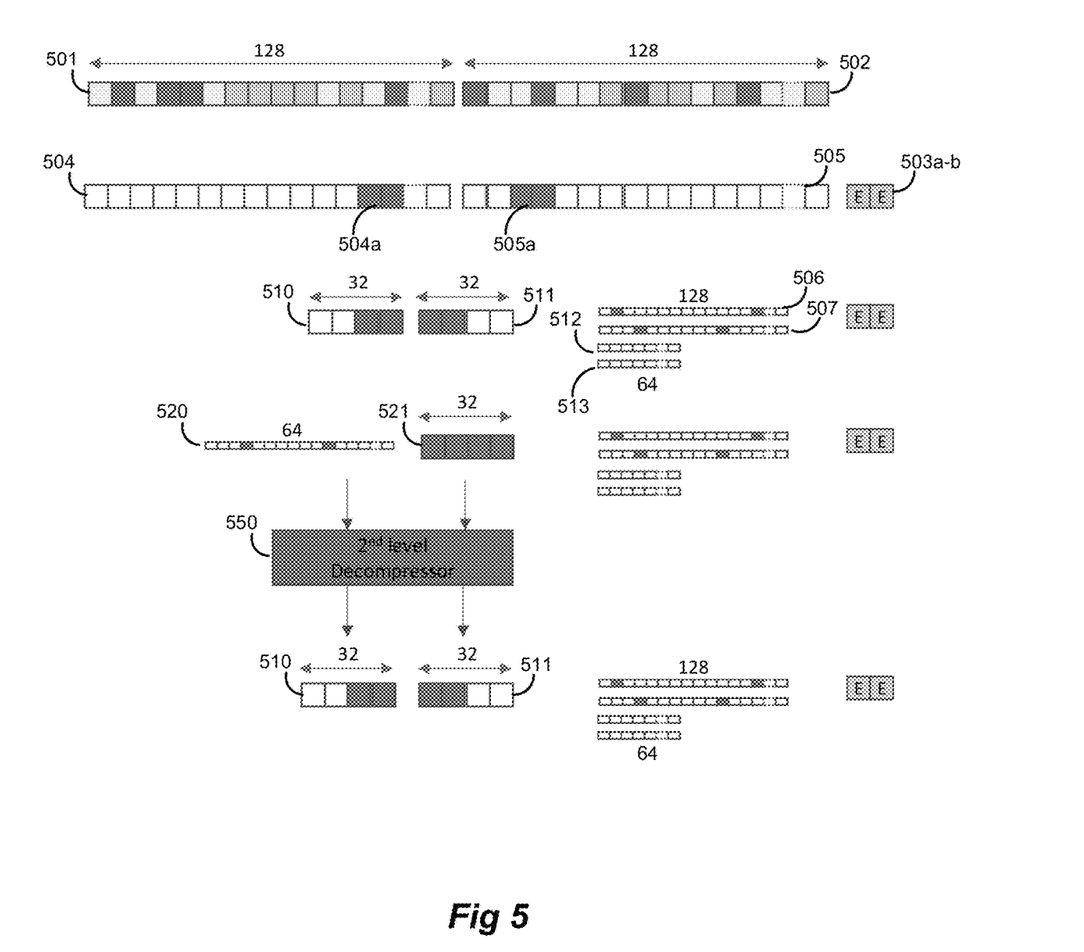
FIG. 5 illustrates another example compression and decompression technique according to an embodiment.

FIG. 5 illustrates another example compression and decompression technique according to an embodiment. In various embodiments, digital values being compressed may be represented in different formats. For instance, the example if FIG. 3 may represent digital data values using an 8 bit mantissa, a sign bit, and a shared exponent. In the example shown in FIG. 5, the values are represented as a 4 bit mantissa, a sign bit, and a shared exponent. However, the same hardware may execute both B and B/2 bit representations, where B is the bit length (B=8 or B/2=4) using substantially the same algorithm as illustrated below.

In FIG. 5, two sets of data 501 and 502 each have M=128 digital values. For the first level compression, 16 (e.g., N/2=16) NZ digital values out of each of the 128 digital values are selected. However, in this case the values are selected in adjacent pairs ("pair-wise) so that the total length of the selected values is 8 bits, which advantageously allows the algorithm (with slight modifications) to run on the same hardware. The selected digital values may be the largest 16 values in each data set, for example. In another embodiment, pairs of values may be selected based on pairwise highest (absolute) value. It is to be understood that a variety of other algorithms are possible. The result is two sparsified data sets 504 and 505, each comprising 128 values of which 16 in each set are pairs of NZ values 504a and 505a, for example. The 128 length data sets may comprise 4-bit mantissas, a sign bit, and a shared exponent illustrated at 503a-b, for example. Additionally, first and second 128 length bit masks 506 and 507 specifying the positions of the 16 NZ values in each set are generated. Each mask specifies locations of the pairs of bits in each sparsified data set. Because the mask specifies pairs of bits, in some embodiments each mask may be half the length of the vectors (e.g., N/2=128/2 =64) advantageously further compressing the data. Next, two 32 length sets 510 and 511 are generated, one from each of the 128 length sets 504 and 505. 32 length sets 510 and 511 each include 16 pairs of NZ values from the corresponding 128 length sets.

For the second level compression, a 64 length bit mask 520 is generated. In some embodiments, bit mask 520 may also be reduced in length to reduce the number of stored bits. Bit mask 520 specifies the positions of the 16 NZ values in each 32 length set 510 and 511. For example, a first half of a 64 bit bit mask may include a '1' in positions where a value is NZ in set 510 and a second half of the 64 bit bit mask may include a '1' in positions where a value is NZ in set 511. Next, a 32 length set 521 of NZ values is generated from the NZ values in the two 32 length sets 510 and 511. The 32 length set 521 of NZ values may be stored in a memory with the 64 length bit mask 520 and the 64 length bit masks 512 and 513.

The multi-stage compressed data may be retrieved at much higher rates than uncompressed or less compressed data. For instance, the 32 length set 521 of NZ values, the 64 length bit mask 520, and the first and second 64 length bit masks may be retrieved from memory and coupled to a $2^{nd}$ level decompression circuit 550. Decompression circuit 550 decompresses the 32 length set 521 of NZ values into two 32 length sets 510-511 that each have 16 NZ values. The 64 length bit mask 520 is used for the second level decompression. Finally, 32 length sets 510 and 511 and 64 length bit masks 512 and 513 (and shared exponents 503*a*-*b*) may be sent to a processor for $1^{st}$ level decompression, where the two 32 length sets are decompressed into two 128 length sets 504 and 505, each having 16 pairs of NZ digital values, using the first and second 64 length bit masks 512 and 513.

Figure 6:
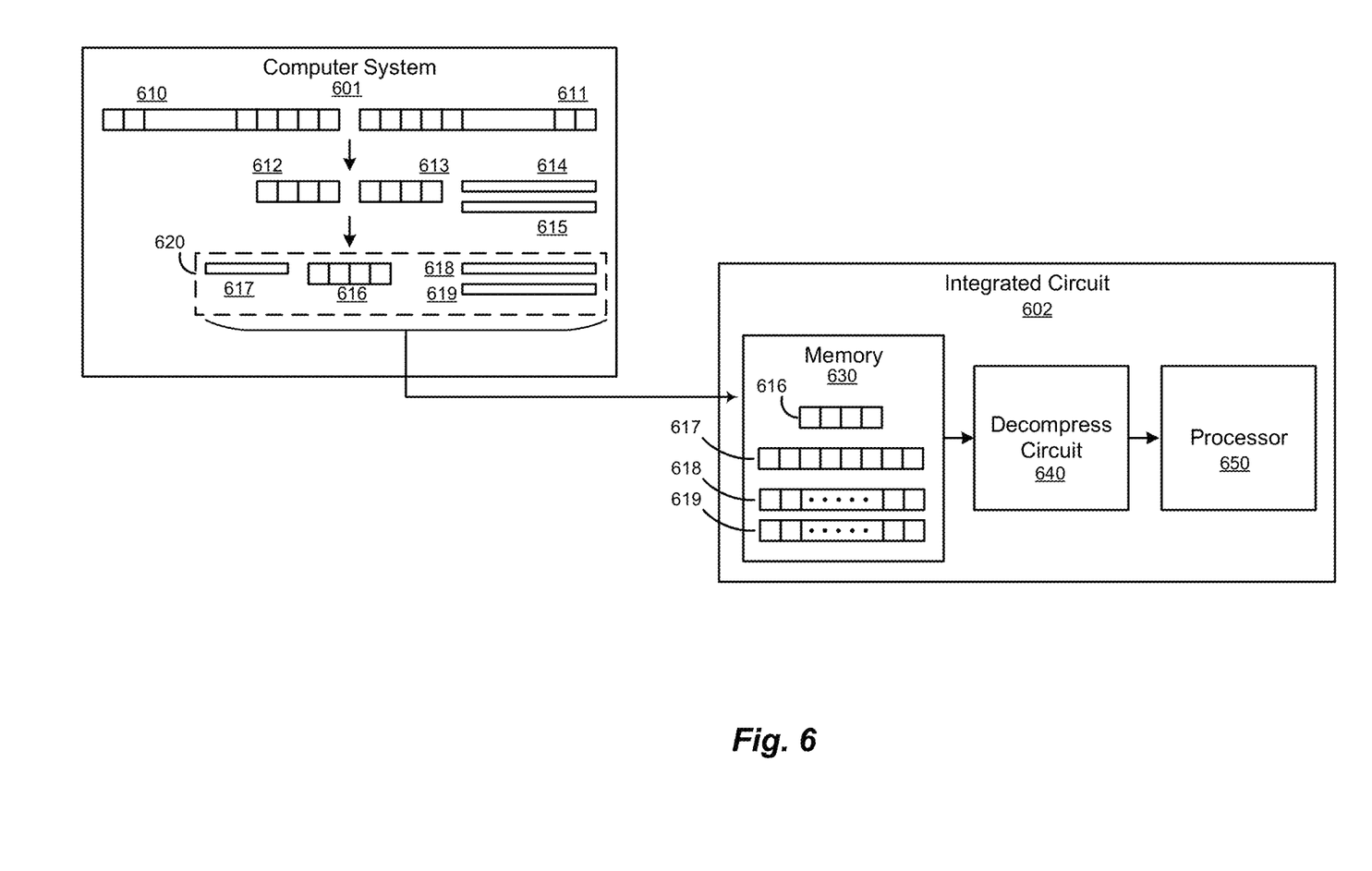
FIG. 6 illustrates system for compressing and decompressing data according to an embodiment.

FIG. 6 illustrates system for compressing and decompressing data according to an embodiment. In this example, digital data values 610 and 611 are compressed by a computer system 601 and loaded into memory 630, which resides on the same integrated circuit 602 as a processor 650 and decompression circuit 650. Computer system 601 may perform the first and second level compression according to various embodiments illustrated in the examples here. Computer system 601 may be a server, for example, and integrated circuit 602 may be coupled to the computer system over a local bus or network connection (e.g., Ethernet). Computer system 601 may implement the first and second level compression in hardware (e.g., a state machine, an ASIC, or FPGA), software, or as a combination of hardware and software, for example. Input vectors of M data values 610 and 611 are compressed into N length vectors 612 and 613, each with N/2 NZ values, and M length bit masks 614 and 615 (or M/2 length bit masks for values selected pairwise). Next, an N length vector 616 of NZ values is generated with a 2*N length bit mask 617. The multi-stage compressed data 620 comprising the bit mask 617, vector of NZ values 616, and M (or M/2) length bit masks 618 and 619 are loaded into memory 630. The data values may then be read from memory 630 by processor 650. Retrieved data is received by decompression circuit 630, which performs the first level decompression described above. Processor 650 may perform the second level decompression, for example.

Volumes of digital data values may be thusly compressed by a multi-stage algorithm and loaded into memory 630 with corresponding reductions in memory usage and memory write and read transactions, thereby reducing the memory bandwidth used to move data into the processor, for example. In one embodiment, the data comprises neural network activations or neural network weights, and processor 650 is an Artificial Intelligence (AI) processor optimized for neural network computations, such as multiplication, accumulation, and the like. An example processor may be optimized for sparse computations, where zeros are ignored and only NZ results are processed by the multipliers, accumulators, or other hardware resources to yield faster results, for example.

Figure 7:
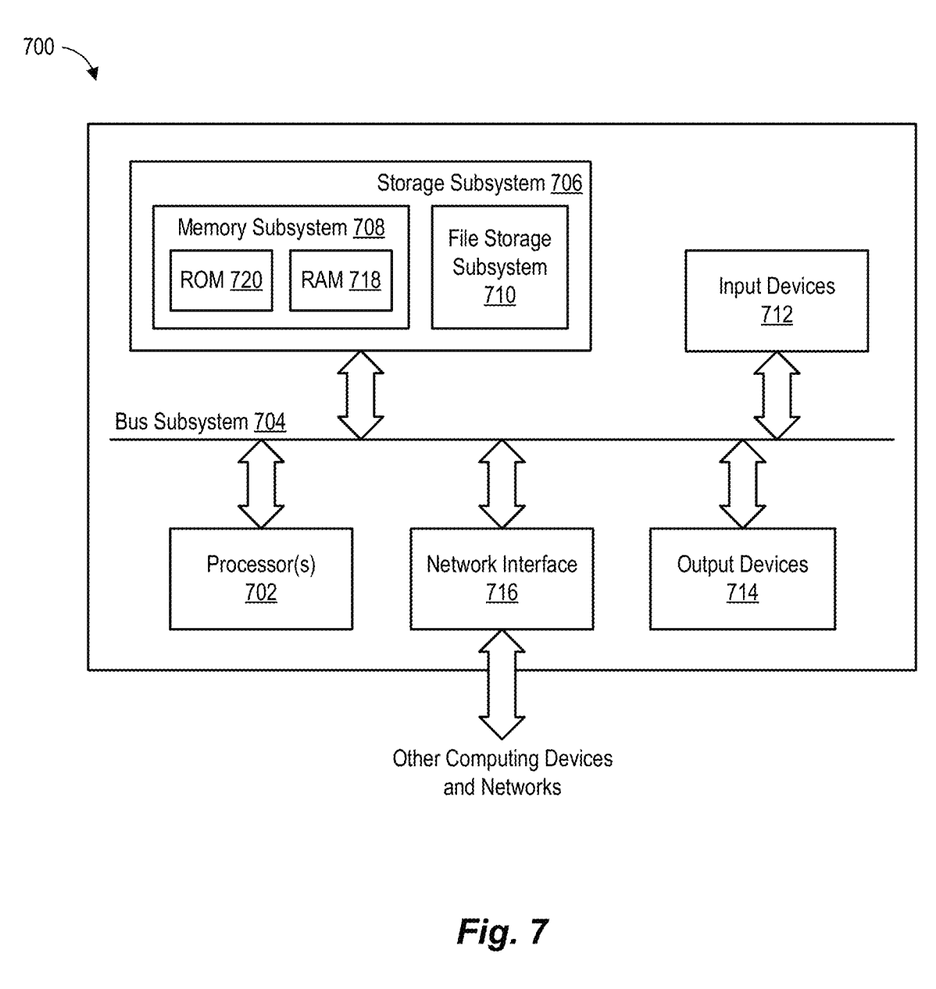
FIG. 7 illustrates a simplified block diagram of an example computer system used to execute code according to various embodiments.

FIG. 7 illustrates a simplified block diagram of an example computer system used to execute program code according to various embodiments. In some embodiments, computer system 700 executes code to compress data, decompress data, or both as set forth herein. In another embodiment computer system 700 executes hardware description code to generate a decompression circuit and/or other portions of an integrated circuit to perform the techniques described herein. A hardware description language (HDL) is a specialized computer language used to describe the structure and behavior of electronic circuits, and most commonly, digital logic circuits. HDL code may be executed on a computer system to generate digital logic circuits, including circuits described herein. FIG. 7 illustrates a simplified block diagram of an example computer system 700, which can be used to implement the techniques described in the foregoing disclosure. In some embodiments, computer system 700 may be used to implement a control processor 702, for example. As shown in FIG. 7, computer system 700 includes one or more processors 702 that communicate with a number of peripheral devices via a bus subsystem 704. These peripheral devices may include a storage subsystem 706 (e.g., comprising a memory subsystem 708 and a file storage subsystem 710) and a network interface subsystem 716. Some computer systems may further include user interface input devices 712 and/or user interface output devices 714.

Bus subsystem 704 can provide a mechanism for letting the various components and subsystems of computer system 700 communicate with each other as intended. Although bus subsystem 704 is shown schematically as a single bus, alternative embodiments of the bus subsystem can utilize multiple busses.

Network interface subsystem 716 can serve as an interface for communicating data between computer system 700 and other computer systems or networks. Embodiments of network interface subsystem 716 can include, e.g., Ethernet, a Wi-Fi and/or cellular adapter, a modem (telephone, satellite, cable, ISDN, etc.), digital subscriber line (DSL) units, and/or the like.

Storage subsystem 706 includes a memory subsystem 708 and a file/disk storage subsystem 710. Subsystems 708 and 710 as well as other memories described herein are examples of non-transitory computer-readable storage media that can store executable program code and/or data that produce circuits having the functionality of embodiments of the present disclosure.

Memory subsystem 708 includes a number of memories including a main random access memory (RAM) 718 for storage of instructions and data during program execution and a read-only memory (ROM) 720 in which fixed instructions are stored. File storage subsystem 710 can provide persistent (e.g., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 700 is illustrative and many other configurations having more or fewer components than system 700 are possible.

FURTHER EXAMPLES

Each of the following non-limiting features in the following examples may stand on its own or may be combined in various permutations or combinations with one or more of the other features in the examples below.

In one embodiment, the present disclosure includes a digital circuit comprising: memory, the memory storing data comprising a plurality of digital values, wherein N non-zero digital values are stored in a block, where N is a first integer, the N non-zero digital values being associated with a first bit mask specifying positions of the N non-zero digital values; a decompression circuit to receive the N non-zero digital values and the first bit mask and produce two N length sets of digital values from the N non-zero digital values, wherein positions of the non-zero digital values in each of the two N length sets of digital values are set based on the first bit mask; and a processor to receive the two N length sets of digital values and two second bit masks, and process the two N length sets of digital values using the two second bit masks.

In another embodiment, the present disclosure includes a method of decompressing data comprising: receiving, from a memory, N non-zero digital values and a first bit mask specifying positions of the N non-zero digital values, where N is a first integer, and wherein the N non-zero digital values are stored in a block associated with the first bit mask; decompressing the N non-zero digital values using the first bit mask to produce two N length sets of digital values each comprising non-zero digital values from the N non-zero digital values, wherein positions of the non-zero digital values in each of the two N length sets of digital values are set based on the first bit mask; and receiving the two N length sets of digital values and two second bit masks in a processor, where M is a second integer greater than N, and processing, by the processor, the two N length sets of digital values using the second bits masks.

In another embodiment, the present disclosure includes a machine-readable medium storing a program executable by a computer, the program comprising sets of instructions for: receiving, from a memory, N non-zero digital values and a first bit mask specifying positions of the N non-zero digital values, where N is a first integer, and wherein the N non-zero digital values are stored in a block associated with the first bit mask; decompressing the N non-zero digital values using the first bit mask to produce two N length sets of digital values each comprising non-zero digital values from the N non-zero digital values, wherein positions of the non-zero digital values in each of the two N length sets of digital values are set based on the first bit mask; and receiving the two N length sets of digital values and two second bit masks in a processor, where M is a second integer greater than N, and processing, by the processor, the two N length sets of digital values using the second bits masks.

In one embodiment, the processor further decompresses the two N length sets of digital values using the two second bit masks into two M length sets of digital values, where M is a second integer greater than N.

In one embodiment, the data stored in the memory comprising the plurality of digital values is compressed using a multi-stage compression algorithm.

In one embodiment, M divided by N is a power of 2.

In one embodiment, the first bit mask is at least of length 2*N and the two N length sets of digital values each comprise N/2 non-zero digital values.

In one embodiment, the two M length bit masks are stored in said memory with the N non-zero digital values and the bit mask of length 2*N.

In one embodiment, the first bit mask comprises 2*N bits.

In one embodiment, the two second bit masks each comprise M bits.

In one embodiment, the N non-zero digital values are stored in the memory as pairs of values.

In one embodiment, the two second bit masks each comprise M/2 bits.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A digital circuit comprising:
    memory, the memory storing data comprising a plurality of digital values, wherein N non-zero digital values are stored in a block, where N is a first integer, the N non-zero digital values being associated with a first bit mask specifying positions of the N non-zero digital values;
    a decompression circuit to receive the N non-zero digital values and the first bit mask and produce two N length sets of digital values from the N non-zero digital values, wherein positions of the non-zero digital values in each of the two N length sets of digital values are set based on the first bit mask; and
    a processor to receive the two N length sets of digital values and two second bit masks, and process the two N length sets of digital values using the two second bit masks.

2. The circuit of claim 1, wherein the processor further decompresses the two N length sets of digital values using the two second bit masks into two M length sets of digital values, where M is a second integer greater than N.

3. The circuit of claim 1, wherein the data stored in the memory comprising the plurality of digital values is compressed using a multi-stage compression algorithm.

4. The circuit of claim 1, wherein M divided by N is a power of 2.

5. The circuit of claim 1, wherein the first bit mask is at least of length 2*N and the two N length sets of digital values each comprise N/2 non-zero digital values.

6. The circuit of claim 5, wherein the two M length bit masks are stored in said memory with the N non-zero digital values and the bit mask of length 2*N.

7. The circuit of claim 5, wherein the first bit mask comprises 2*N bits.

8. The circuit of claim 1, wherein the two second bit masks each comprise M bits.

9. The circuit of claim 1, wherein the N non-zero digital values are stored in the memory as pairs of values.

10. The circuit of claim 9, wherein the two second bit masks each comprise M/2 bits.

11. A method of decompressing data comprising:
    receiving, from a memory, N non-zero digital values and a first bit mask specifying positions of the N non-zero digital values, where N is a first integer, and wherein the N non-zero digital values are stored in a block associated with the first bit mask;
    decompressing the N non-zero digital values using the first bit mask to produce two N length sets of digital values each comprising non-zero digital values from the N non-zero digital values, wherein positions of the non-zero digital values in each of the two N length sets of digital values are set based on the first bit mask; and
    receiving the two N length sets of digital values and two second bit masks in a processor, where M is a second integer greater than N, and processing, by the processor, the two N length sets of digital values using the second bits masks.

12. The method of claim 11, wherein the processor further decompresses the two N length sets of digital values using the two second bit masks into two M length sets of digital values, where M is a second integer greater than N.

13. The method of claim 11, wherein the N non-zero digital values are stored in the memory as pairs of values.

14. The method of claim 11, wherein the data stored in the memory comprising the plurality of digital values is compressed using a multi-stage compression algorithm.

15. The method of claim 11, wherein the two M length bit masks are stored in said memory with the N non-zero digital values and the bit mask.

16. The method of claim 11, wherein M divided by N is a power of 2.

17. The method of claim 11, wherein the first bit mask comprises 2*N bits.

18. The method of claim 11, wherein the two second bit masks each comprise M bits.

19. The method of claim 11, wherein the N non-zero digital values are stored in the memory as pairs of values.

20. A non-transitory machine-readable medium storing a program executable by a computer, the program comprising sets of instructions for:

receiving, from a memory, N non-zero digital values and a first bit mask specifying positions of the N non-zero digital values, where N is a first integer, and wherein the N non-zero digital values are stored in a block associated with the first bit mask;

decompressing the N non-zero digital values using the first bit mask to produce two N length sets of digital values each comprising non-zero digital values from the N non-zero digital values, wherein positions of the non-zero digital values in each of the two N length sets of digital values are set based on the first bit mask; and receiving the two N length sets of digital values and two second bit masks in a processor, where M is a second integer greater than N, and processing, by the processor, the two N length sets of digital values using the second bits masks.

* * * * *